US009159574B2

(12) United States Patent
Yu et al.

(10) Patent No.: US 9,159,574 B2
(45) Date of Patent: Oct. 13, 2015

(54) METHOD OF SILICON ETCH FOR TRENCH SIDEWALL SMOOTHING

(71) Applicant: APPLIED MATERIALS, INC., Santa Clara, CA (US)

(72) Inventors: Keven Yu, Union City, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/973,541

(22) Filed: Aug. 22, 2013

(65) Prior Publication Data

US 2014/0057446 A1 Feb. 27, 2014

Related U.S. Application Data (60) Provisional application No. 61/693,601, filed on Aug. 27, 2012, provisional application No. 61/775,135, filed on Mar. 8, 2013.

(51) Int. Cl.
*H01L 21/3065* (2006.01)
*H01L 21/311* (2006.01)
(Continued)

(52) U.S. Cl.
CPC ........ *H01L 21/3065* (2013.01); *B81C 1/00619* (2013.01); *H01L 21/30655* (2013.01); *H01L 21/31138* (2013.01); *H01L 21/76898* (2013.01)

(58) Field of Classification Search
CPC ..................... H01L 21/30655; H01L 21/3065; H01L 21/31138; H01L 21/76898; B81B 2203/033; B81C 1/00619
See application file for complete search history.

(56) References Cited

U.S. PATENT DOCUMENTS

| 4,049,944 A | 9/1977 | Garvin et al. |
| 5,593,606 A | 1/1997 | Owen et al. |

(Continued)

FOREIGN PATENT DOCUMENTS

| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining", www.small-journal.com, 2005, 1, No. 7, 7 pgs.
(Continued)

*Primary Examiner* — Lan Vinh
*Assistant Examiner* — Jiong-Ping Lu
(74) *Attorney, Agent, or Firm* — Blakely Sokoloff Taylor Zafman LLP (57) ABSTRACT

Methods of silicon etch for trench sidewall smoothing are described. In one embodiment, a method involves smoothing a sidewall of a trench formed in a semiconductor wafer via plasma etching. The method includes directionally etching the semiconductor wafer with plasma generated from a fluorine gas to smooth the sidewall of the trench, the trench having a protective layer formed by plasma generated by a second process gas such as oxygen or a polymerization gas. In another embodiment, a method involves etching a semiconductor wafer to generate a trench having a smooth sidewall. The method includes plasma etching the semiconductor wafer with one or more first process gases including a fluorine gas, simultaneously performing deposition and plasma etching the semiconductor wafer with one or more second process gases including a fluorine gas and a polymerization gas mix, and performing deposition with one or more third process gases including a polymerization gas.

14 Claims, 9 Drawing Sheets

(51) Int. Cl.
*B81C 1/00* (2006.01)
*H01L 21/768* (2006.01)

(56) References Cited

U.S. PATENT DOCUMENTS

| | | | |
|---|---|---|---|
| 6,057,180 A | 5/2000 | Sun et al. |
| 6,174,271 B1 | 1/2001 | Kosmowski |
| 6,306,731 B1 | 10/2001 | Igarashi et al. |
| 6,407,363 B2 | 6/2002 | Dunsky et al. |
| 6,465,158 B1 | 10/2002 | Sekiya |
| 6,528,864 B1 | 3/2003 | Arai |
| 6,574,250 B2 | 6/2003 | Sun et al. |
| 6,582,983 B1 | 6/2003 | Runyon et al. |
| 6,593,542 B2 | 7/2003 | Baird et al. |
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,639 B2 | 3/2009 | Nakamura |
| 7,629,228 B2 | 12/2009 | Haji et al. |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 | 3/2011 | Arita et al. |
| 7,923,351 B2 | 4/2011 | Arita |
| 7,927,973 B2 | 4/2011 | Haji et al. |
| 2003/0162313 A1 | 8/2003 | Kim et al. |
| 2003/0211752 A1 | 11/2003 | Rattner et al. |
| 2004/0080045 A1 | 4/2004 | Kimura et al. |
| 2004/0137700 A1 | 7/2004 | Sekiya |
| 2006/0043535 A1 | 3/2006 | Hiatt |
| 2006/0205182 A1 | 9/2006 | Soejima |
| 2006/0205238 A1* | 9/2006 | Chinn et al. ............ 438/792 |
| 2007/0015371 A1 | 1/2007 | Olynick et al. |
| 2009/0184089 A1* | 7/2009 | Chebi et al. ............. 216/13 |
| 2009/0255911 A1 | 10/2009 | Krishnaswami et al. |
| 2010/0055400 A1* | 3/2010 | Farr et al. ............... 428/156 |
| 2011/0312157 A1 | 12/2011 | Lei et al. |
| 2012/0139127 A1 | 6/2012 | Beyne |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection", U.S. Appl. No. 61/491,693, filed May 31, 2011 24 pgs.

Nakamura, Tomoji et al., "Comparative Study of Side-Wall Roughness Effects on Leakage Currents in Through-Silicon Via Interconnects", Fujitsu Laboratories Ltd., Morinosato-Wakamiya, Atsugi, Kanagawa, Japan, The University of Tokyo, Yayoi, Bunkyo-ku, Tokyo, 3D Systems Integration Conference (3DIC), 2011 IEEE.

Wu, B. et al., "High aspect ratio silicon etch—A review," J. Appl. Phys., vol. 108, p. 051101, 2010.

International Search Report and Written Opinion from PCT/US2013/056382 mailed Dec. 26, 2013, 10 pages.

International Preliminary Report on Patentability from PCT/US2013/056382 mailed Mar. 12, 2015, 7 pages.

\* cited by examiner

METHOD OF SILICON ETCH FOR TRENCH SIDEWALL SMOOTHING

CROSS REFERENCE TO RELATED APPLICATIONS

This application claims the benefit of priority to U.S. Provisional Application No. 61/693,601 filed on Aug. 27, 2012, titled "METHOD OF SILICON ETCH FOR TRENCH SIDEWALL SMOOTHING," and U.S. Provisional Application No. 61/775,135 filed on Mar. 8, 2013, titled "METHOD OF SILICON ETCH FOR TRENCH SIDEWALL SMOOTHING," the entire contents of which are hereby incorporated by reference in their entirety for all purposes.

BACKGROUND

1) Field

Embodiments of the present invention pertain to the field of semiconductor processing and, in particular, to methods of silicon etch for trench sidewall smoothing.

2) Description of Related Art

Demand for smaller and lighter electronic devices with higher performance and increased features is driving the adoption of three dimensional (3D) integrated circuits (ICs) designed with through silicon vias (TSVs). TSVs are electrical connections which pass through layers of a semiconductor wafer. Despite the increased interest in TSVs, adoption of TSVs has been slowed due to, for example, high costs and challenges associated with high volume manufacturing. One such challenge includes creating TSV trenches with smooth sidewalls. Trenches with smooth sidewalls are generally more robust and can be effectively filled with materials such as dielectrics and metals. In contrast, trenches with rough sidewalls (e.g., scalloped sidewalls) can result in ineffective filling, leading to reduced yield and long-term device reliability problems. Unfortunately, existing methods of TSV etching create trenches with rough sidewalls, and/or are impractical for high volume manufacturing. Another factor influencing adoption of TSVs includes the cost of performing plasma etching, which is influenced by, for example, the overall silicon etch rate.

SUMMARY

One or more embodiments of the invention are directed to methods of silicon etch for trench sidewall smoothing. In one embodiment, a method of smoothing a sidewall of a trench formed in a semiconductor wafer via plasma etching involves supporting the semiconductor wafer with a pedestal in a processing chamber. The method includes introducing a fluorine gas and a second gas into the processing chamber. In one embodiment the second gas is oxygen. In another embodiment, the second gas is a polymerization gas. The method includes delivering power to the processing chamber to generate plasma from the fluorine gas and the second gas, the plasma generated from the second gas to form a protective layer on the sidewall of the trench. The method further includes directionally etching the semiconductor wafer with the plasma generated from the fluorine gas to smooth the sidewall of the trench with the protective layer.

In one embodiment, a plasma etch system for smoothing a sidewall of a trench formed via plasma etching in a semiconductor wafer includes a plasma etch chamber and a pedestal to support the semiconductor wafer in the plasma etch chamber. The system includes one or more gas sources to introduce a fluorine gas and a second gas into the plasma etch chamber. The system includes a power source to deliver power to the plasma etch chamber to generate plasma from the fluorine gas and the second gas, the plasma generated from the second gas to form a protective layer on the sidewall of the trench in the semiconductor wafer. The plasma etch chamber is to directionally etch the semiconductor wafer with the plasma generated from the fluorine gas to smooth the sidewall of the trench with the protective layer.

In one embodiment, a method of etching a semiconductor wafer to generate a trench having a smooth sidewall involves plasma etching the semiconductor wafer with one or more first process gases comprising a fluorine gas. The method includes simultaneously performing deposition and plasma etching the semiconductor wafer with one or more second process gases comprising a fluorine gas and a polymerization gas. The method involves performing deposition with one or more third process gases comprising a polymerization gas.

DETAILED DESCRIPTION

Systems and methods of silicon etch for creating a smooth trench sidewall are described. "Smooth sidewalls" refers to sidewalls which are substantially smooth and free of large scallops or other rough features. "Smooth sidewalls" may still include some roughness such as small scallops (e.g., scallops having a size of less than ~5 nm). According to embodiments, methods of etching described herein can virtually eliminate scallops without impacting other profile attributes and without substantially impacting processing time. Some embodiments of the invention relate to smoothing a rough trench sidewall after trench formation, and other embodiments relate to generating a smooth trench sidewall during trench formation. For example, in one embodiment a method includes directionally etching a semiconductor wafer or silicon substrate to smooth rough sidewalls of silicon trenches produced using a Bosch process or other etching process resulting in rough sidewalls. Directionally etching the silicon can include generating plasma from a fluorine gas and another gas which forms a protective layer on the sidewall of the trench while etching the sidewall to remove scallops.

In another embodiment, a trench is generated with smooth sidewalls with a process which includes simultaneously performing deposition and plasma etching with process gases including a fluorine gas and a polymerization gas. These techniques can enable generation of trenches with smooth sidewalls for any application in which rough sidewalls are undesirable. For example, embodiments of the invention can enable TSV trenches which are more robust for dielectric and metal materials filling, improving yield and long-term reliability.

In the following description, numerous specific details are set forth, such as specific plasma treatments, in order to provide a thorough understanding of embodiments of the present invention. It will be apparent to one skilled in the art that embodiments of the present invention may be practiced without these specific details. In other instances, well-known aspects, such as photolithography patterning and development techniques for photoresist mask formation, are not described in detail in order to not unnecessarily obscure embodiments of the present invention. The examples described below generally refer to etching a silicon substrate, however, embodiments of the invention may be used to create smooth trench walls in other material substrates. Furthermore, it is to be understood that the various embodiments shown in the Figures are illustrative representations and are not necessarily drawn to scale.

Figure 1:
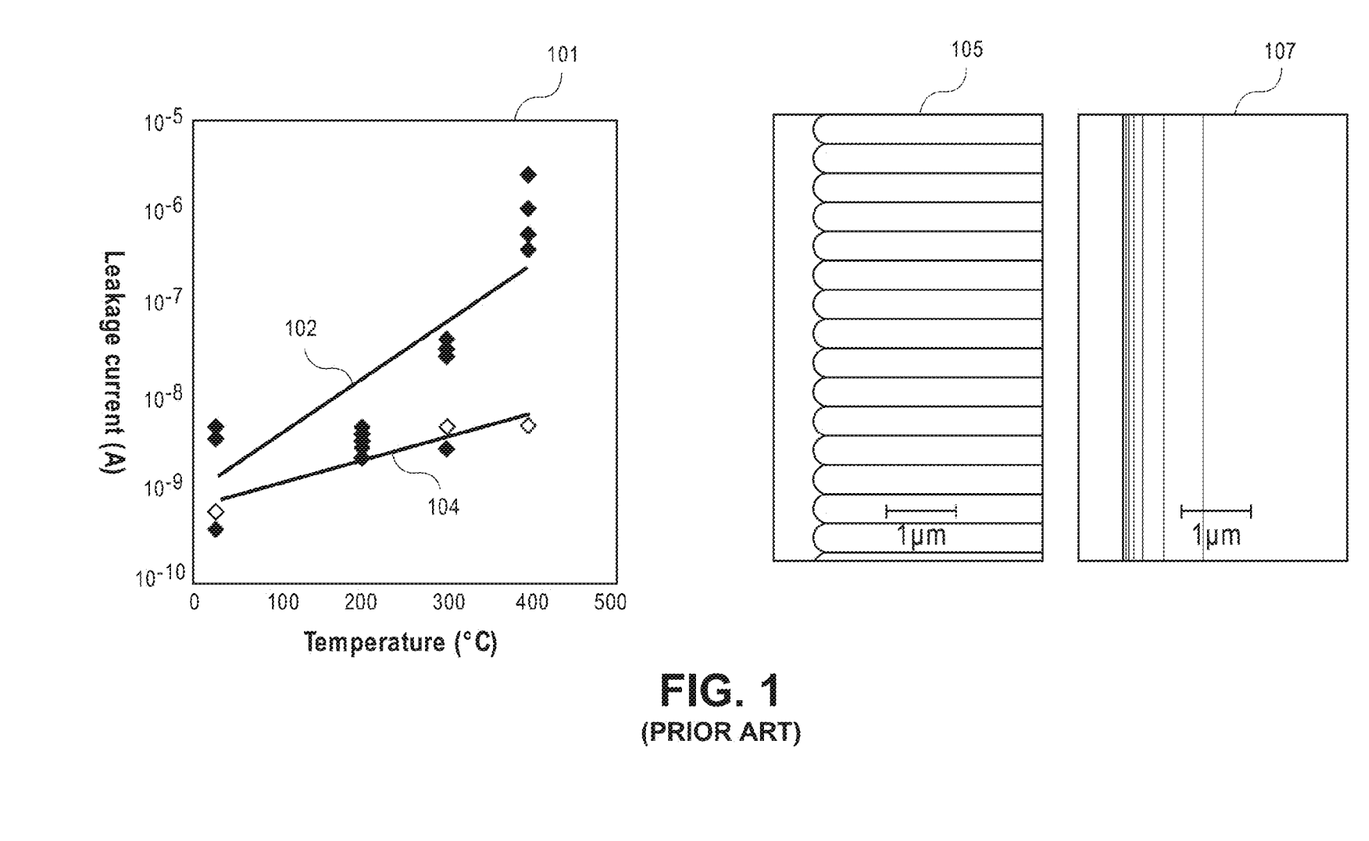
FIG. 1 is a prior art graph illustrating temperature dependence of leakage currents for TSV samples with different sidewall roughness.

FIG. 1 is a prior art graph illustrating temperature dependence of leakage currents for TSV samples with different sidewall roughness. The graph 101 in FIG. 1 includes data from the article: "Comparative study of side-wall roughness effects on leakage currents in through-silicon via interconnects," by Nakamura, T.; Kitada, H.; Mizushima, Y.; Maeda, N.; Fujimoto, K.; and Ohba, T., 3D Systems Integration Conference (3DIC), 2011 IEEE International, vol., no., pp. 1, 4, Jan. 31, 2012-Feb. 2, 2012. The graph 101 illustrates leakage current measured from samples including multiple TSVs in a four-by-four arrangement and biased at 10V. Line 102 is fit to data points collected for TSVs with scalloped walls, such as the scalloped sidewalls of the trench 105. The trench 105 corresponding to line 102 was created by a Bosch process. Typically a Bosch process includes a period of etching followed by a period of deposition. For example, a directional bombardment etch and/or an isotropic chemical etch may be followed by a period of deposition (e.g., polymer deposition). The periods of etching and deposition are clearly separate and delineated, and are repeated until the desired level of etching is achieved (e.g., until the desired trench depth is achieved). The Bosch process is typically used for TSV trench formation because it may allow for a high aspect ratio profile angle. The Bosch process can also allow for bottom critical dimension tuning capability, and may have a high selectivity to photoresist. Unfortunately, the Bosch process typically results in a scalloped sidewall as illustrated by the trench 105.

Line 104 is fit to data points collected for TSVs with smooth walls, such as the smooth sidewalls of trench 107. The smooth sidewalled trench 107 was created with a non-Bosch dry etching process (e.g., a cryogenic dry etch), in which the silicon substrate is maintained at a low temperature (around −100° C.) with $SF_6$ and $O_2$ gases to etch the Silicon. Although a trench with a smooth sidewall was achieved with the cryogenic dry etch, cryogenic dry etch is a slow dry etch process using etch equipment that may be impractical for large scale manufacture. The cryogenic dry etch is also not a sidewall angle control process.

As can be seen from the graph 101 of FIG. 1, TSVs with scalloped sidewalls (corresponding to line 102) seem to exhibit higher leakage current than TSVs with smoother sidewalls (corresponding to line 104). Also of note is that data collected for the TSVs with scalloped sidewalls has greater overall variability, and that the leakage current for TSVs with scalloped sidewalls varies more with changes in temperature than TSVs with smooth sidewalls.

It is important to note the scallop size used to collect the data in graph 101 is relatively large (>70 nm) compared to some industry standard scallop targets (e.g., nm). However, similar results are likely to occur with TSVs having smaller scallops such as scalloped in the 30 nm range. Thus, FIG. 1 illustrates examples of why smooth trench sidewalls may be desirable for TSVs. The following figures will discuss systems and methods for generating a smooth trench sidewall.

Figure 2:
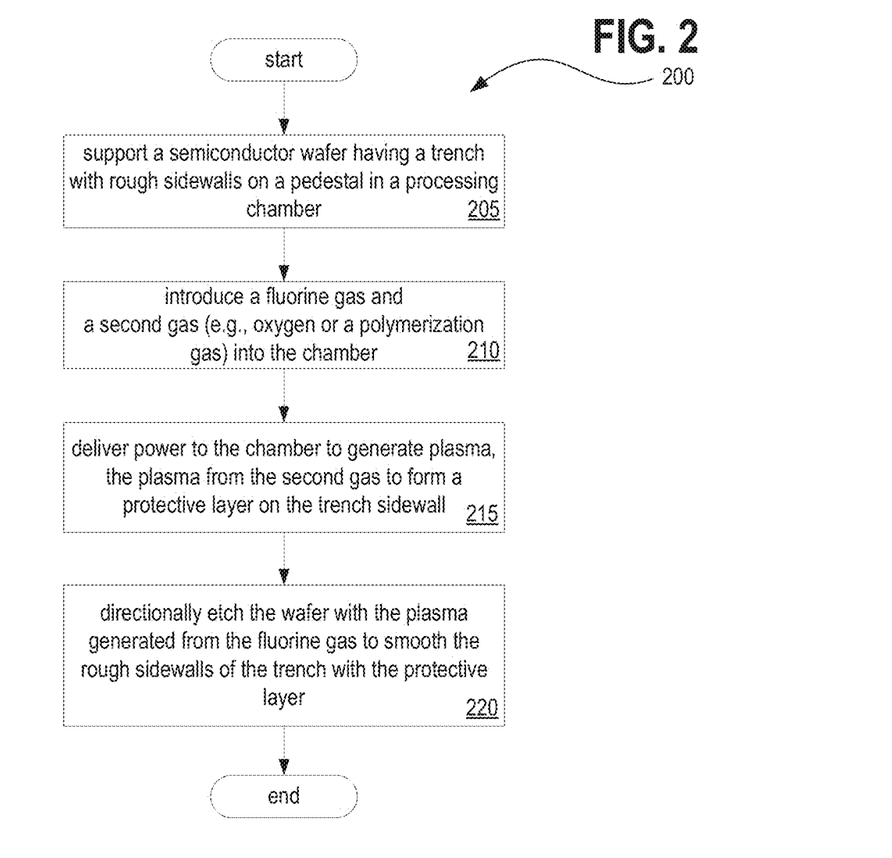
FIG. 2 is a flow diagram of a method of smoothing a sidewall of a trench formed in a semiconductor wafer via plasma etching, according to an embodiment.

FIG. 2 is a flow diagram of a method of smoothing a sidewall of a trench formed in a semiconductor wafer via plasma etching, according to an embodiment. The embodiment illustrated by method 200 involves eliminating scallops from the trench sidewall post-trench formation. The pre-formed trench may include, for example, a TSV trench.

The method 200 begins at operation 205 by supporting a semiconductor wafer on a pedestal in a processing chamber. The semiconductor wafer has a trench having rough sidewalls to be smoothed. For example, a Bosch process may have formed the trench in the semiconductor wafer, resulting in a scalloped trench sidewall. At operation 210, the method includes introducing a fluorine gas and a second gas into the chamber.

At operation 215, the method includes delivering power to the chamber to generate plasma. In one embodiment, delivering power to the processing chamber involves applying an RF power source to a plasma source (e.g., an inductively coupled plasma (ICP) coil in the processing chamber) and biasing the semiconductor wafer with a plurality of RF power pulses. In one embodiment, the RF power source applied to the plasma source is in the range of ~500-3000 Watts. According to another embodiment, the RF power source applied to the plasma source is in the range of ~500-2000 Watts. Biasing the semiconductor wafer may involve applying a plurality of power pulses in the range of ~50-1000 Watts, and may have positive or negative polarity. In one embodiment, biasing the semiconductor wafer involves applying a plurality of power pulses in the range of ~500 Watts each.

The plasma generated from the second gas is to form a protective layer on the trench sidewall. The chemical composition of the second gas (and therefore of the protective layer to be formed on the trench sidewall) may depend upon, for example, whether a mask layer is disposed over the semiconductor wafer. A mask layer disposed over the semiconductor wafer can be a photoresist mask (e.g., a Polyimide (PI)), an oxide mask, or any other etch mask to protect the wafer during etching processes. Thus, embodiments in which a mask layer is removed prior to scallop removal may employ a different chemistry than an embodiment in which the mask layer is not removed prior to scallop removal. In one embodiment in which the mask layer is removed prior to scallop removal, the second gas introduced into the processing chamber includes an oxygen gas. In another embodiment in which the mask layer is not removed prior to scallop removal, the second gas introduced into the processing chamber includes a polymerization gas such as, for example, a carbon fluoride gas. Carbon fluoride gases employed may include, for example, $CHF_3$, $C_2F_6$, $C_3F_8$, or $C_4F_8$.

At operation 220, the method includes directionally etching the semiconductor wafer with the plasma generated from the fluorine gas to smooth the sidewall of the trench with the protective layer. The composition of the protective layer depends on the composition of the second gas. Plasma generated from oxygen gas may form a silicon oxide layer on the sidewall of the trench, which protects the sidewall during the etching process. Plasma generated from polymerization gas may form a polymer layer (e.g., $CF_2$) on the sidewall of the trench. Directionally etching the semiconductor wafer with the plasma generated from the fluorine gas can involve removing the scallops from the sidewall of the trench with the protective layer.

Figure 3:
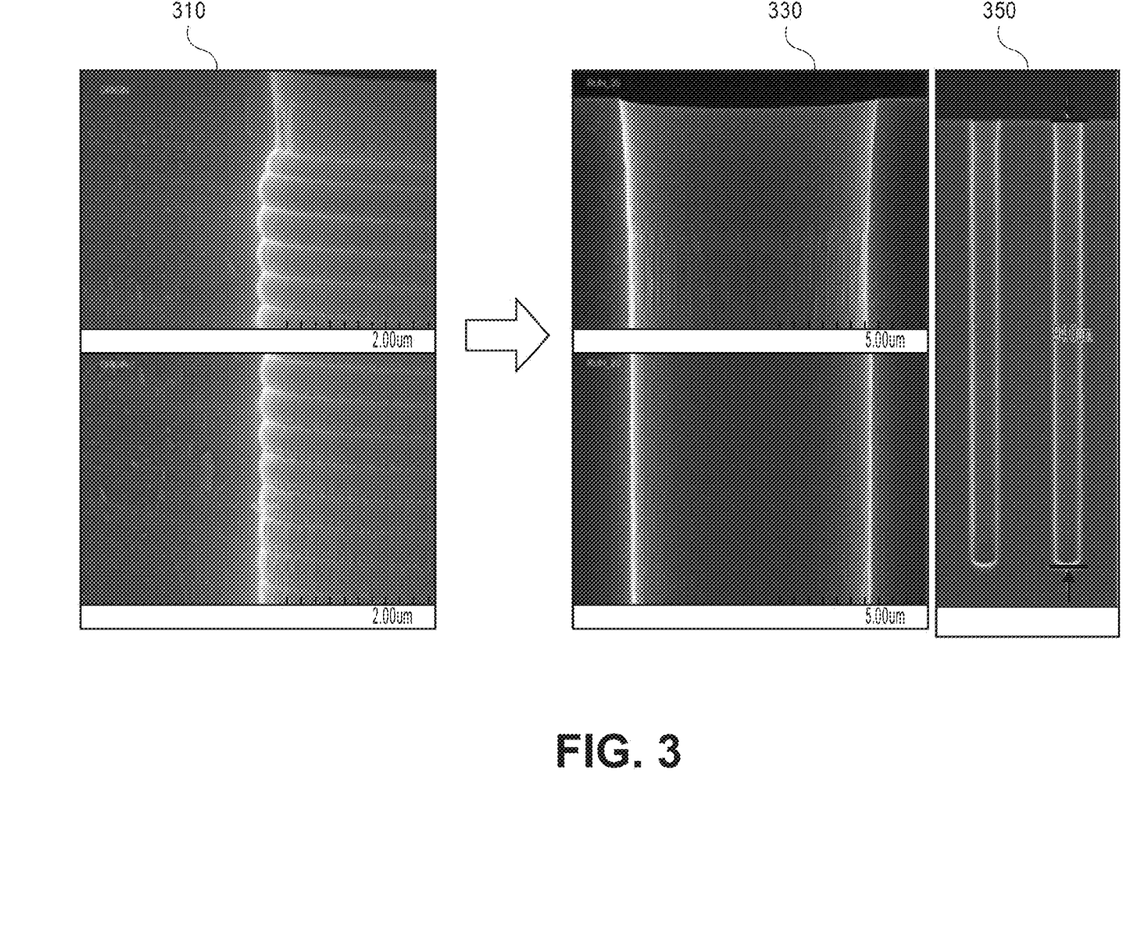
FIG. 3 is an image of a trench sidewall profile before and after sidewall smoothing performed after mask removal, according to an embodiment.
Figure 4:
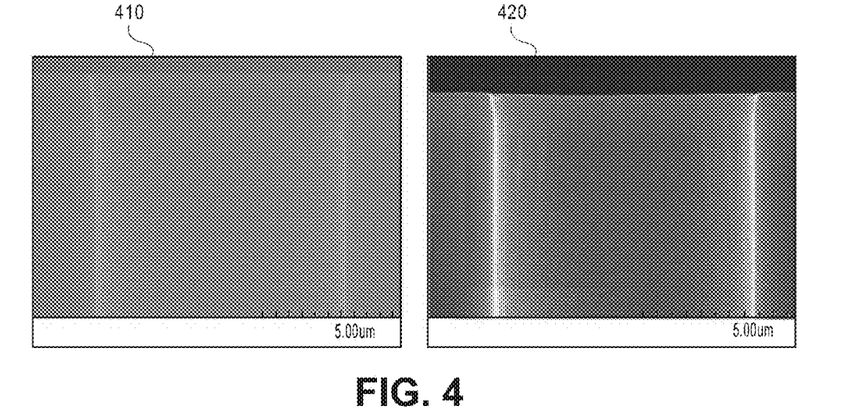
FIG. 4 is image of a trench sidewall profile before and after sidewall smoothing performed after mask removal, according to an embodiment.

As indicated above with respect to operations 210 and 215 of method 200, the gas mixture introduced into the processing chamber for post-trench formation smoothing may depend on whether the smoothing process is performed prior to or after mask removal. FIG. 3 is an image of a trench sidewall profile before and after sidewall smoothing performed after mask removal, according to an embodiment. The image 310 shows a trench created with a Bosch process in a 300 mm wafer. As is shown in the image 350, the trench in this example is 94 µm deep. As is evident from the image 310, the Bosch process created a trench with a scalloped sidewall. The image 330 shows the same trench as in the image 310 after a smoothing process performed after mask removal (e.g., a mild flash etch after mask removal to remove the sidewall scallops while preserving the via profile). FIG. 4 is another view of a trench sidewall profile before and after sidewall smoothing performed after mask removal, according to an embodiment. The image 410 shows a sidewall profile of a trench with scallops prior to mask removal, and the image 420 shows the trench post scallop elimination performed after mask removal. This approach of smoothing the sidewall post trench formation and after mask removal may provide a fast and effective process for removing scallops, but may have limitations if a field oxide needs to be preserved.

Figure 5:
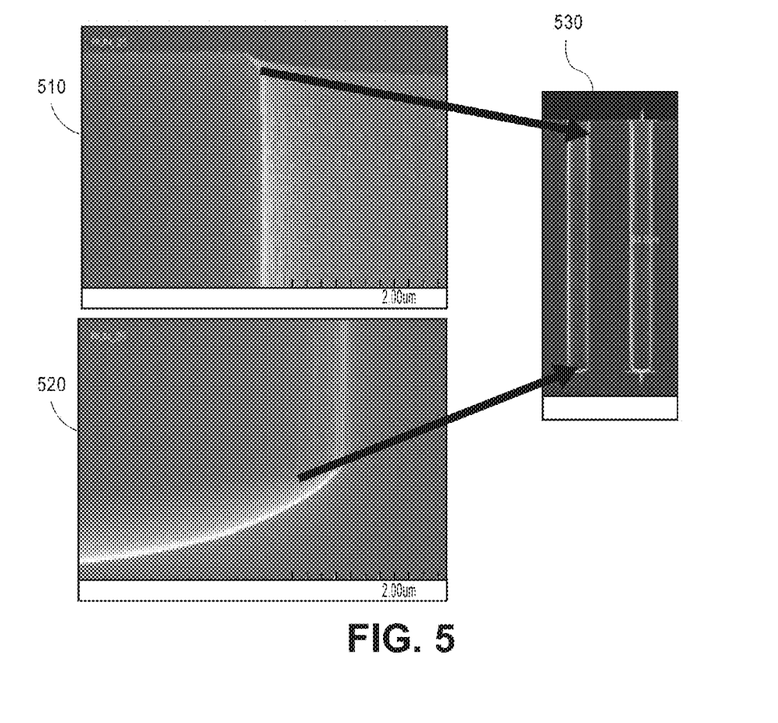
FIG. 5 is an image of a trench sidewall profile after sidewall smoothing performed before mask removal, according to an embodiment.

FIG. 5 is an image of a trench sidewall profile after sidewall smoothing performed before mask removal, according to an embodiment. Similar to the images in FIGS. 3 and 4, the images in FIG. 5 show a 94 µm deep trench created in a 300 mm wafer. The images 510, 520, and 530 are of the trench after a smoothing process performed prior to mask removal. The images 510 and 520 are magnified images of the top and bottom of a trench of image 530. As can be seen from the images in FIG. 5, the trenches are smooth and scallop-free. In this approach where scallop elimination is done prior to stripping the mask, the field oxide can be protected while the scallops are smoothed. The mixture of chemistry is used to simultaneously remove sidewall polymer and smoothen the scallops. Such an approach may require a thicker mask over the semiconductor wafer because a portion of the mask may be consumed during the smoothing process.

As discussed above, FIGS. 2-5 and the corresponding descriptions are related to embodiments of smoothing a trench sidewall after trench formation. In other embodiments, a trench sidewall is smoothed during trench formation, such as by the method illustrated in FIG. 6.

Figure 6:
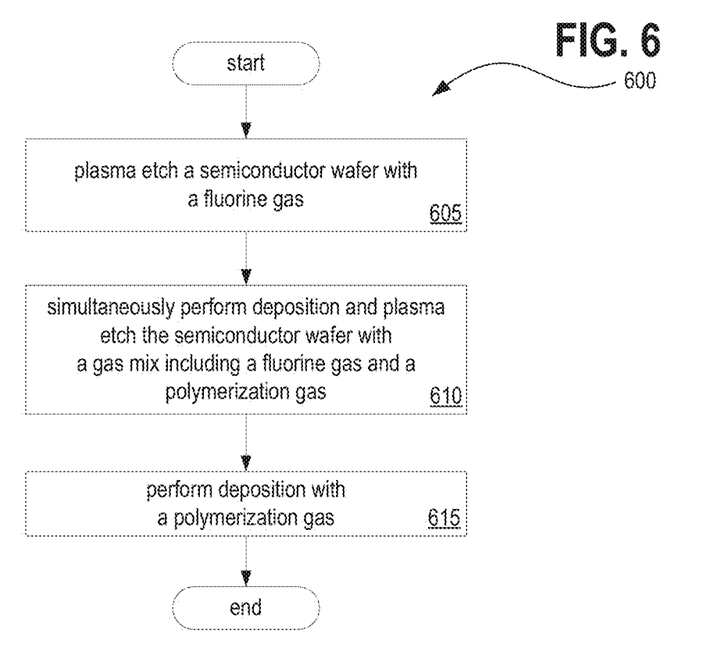
FIG. 6 is a flow diagram of a method of smoothing a sidewall of a trench during formation of the trench, according to an embodiment.

FIG. 6 is a flow diagram of a method of smoothing a sidewall of a trench during formation of the trench, according to an embodiment. The method 600 of FIG. 6 begins with plasma etching a semiconductor wafer with one or more process gases including a fluorine gas at operation 605. At operation 610, the method includes simultaneous deposition and etching of the semiconductor wafer with a mix of gases including a fluorine gas and a polymerization gas.

At operation 615, deposition is performed using one or more gases including a polymerization gas. The polymerization gas used in operations 610 and 615 can include a carbon fluoride gas such as, for example, $CHF_3$, $C_2F_6$, $C_3F_8$, or $C_4F_8$. In one embodiment, the operations 605, 610, and 615 which include periods of etching, simultaneous deposition and etching, and deposition, are iteratively performed to generate the trench in the semiconductor wafer with the smooth sidewall. The iterations may be terminated upon etching to the desired depth. Unlike a typical Bosch process, which includes only clearly delineated periods of etching and deposition, the method 600 includes a period (at operation 610) where both deposition and etching are performed. Thus, in this approach, a controlled smoothening of the scallops may be achieved throughout the etch process, and sidewall passivation is maintained such that there is no sidewall attack from the etch species to prevent top undercut or sidewall damage.

Figure 7:
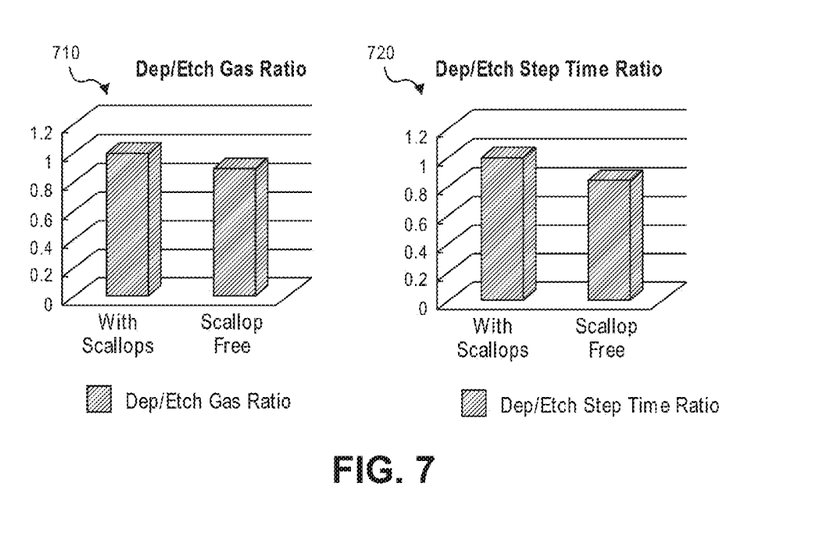
FIG. 7 illustrates graphs showing normalized deposition/etch gas and deposition/etch time ratios for in-situ scallop removal during trench formation, according to an embodiment.

Many process parameters may impact whether a trench has scallops and scallop size, such as plasma source power, bias power, gas flow rates, and pressure. In particular, the ratio of deposition and etch gases in operation 610 and the deposition and etch step times may be carefully balanced to achieve a scallop-free profile without creating an undercut at the top, according to embodiments. FIG. 7 illustrates an example of normalized deposition/etch gas ratios and deposition/etch time ratios for in-situ scallop removal during etching as described with respect to method 600 of FIG. 6. The deposition/etch gas ratio shown in graph 710 may refer to the ratio of polymerization gas to fluorine gas employed in the operation 610 of method 600. The deposition/etch step time ratio shown in graph 720 may refer to the step times of the operations of method 600. The deposition/etch step time ratio may vary from 2.0 to 0.5 and may depend on the other plasma parameters, according to an embodiment. As can be seen in the graphs 710 and 720, the ratio of deposition/etch gases and deposition/etch step times can determine whether the trenches are scalloped or scallop-free.

Figure 8:
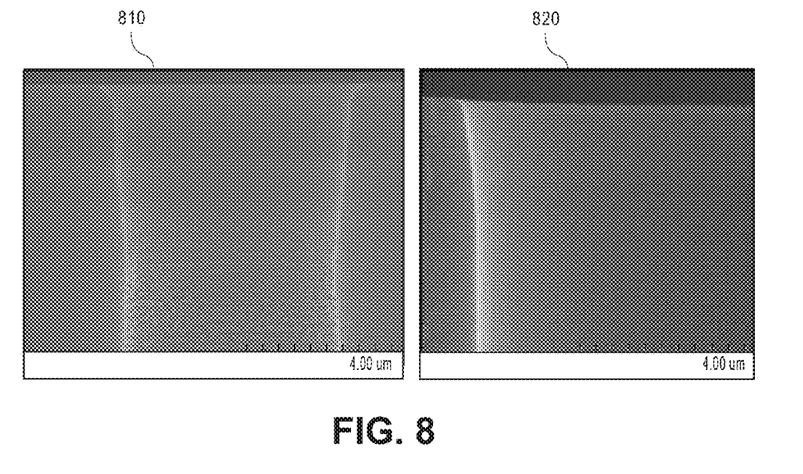
FIG. 8 is an image of trench sidewall profiles generated with different deposition/etch step times, according to an embodiment.

FIG. 8 is an image of trench sidewall profiles generated with different deposition/etch step times, according to an embodiment. The image 810 of FIG. 8 shows a trench with small scallops formed during etch by using a lower deposition/etch step time ratio (e.g., the deposition/etch step time ratio illustrated in FIG. 7 for a trench with scallops). Image 820 shows a scallop-free trench formed with a higher deposition/etch step time ratio (e.g., the ratio illustrated in FIG. 7 for a trench without scallops), as well as using optimal source and bias power ratios. Thus, an etching process including a period of simultaneous deposition and etching with a proper ratio of fluorine gas and polymerization gas can generate trenches with smooth sidewalls for applications such as TSVs.

Figure 9:
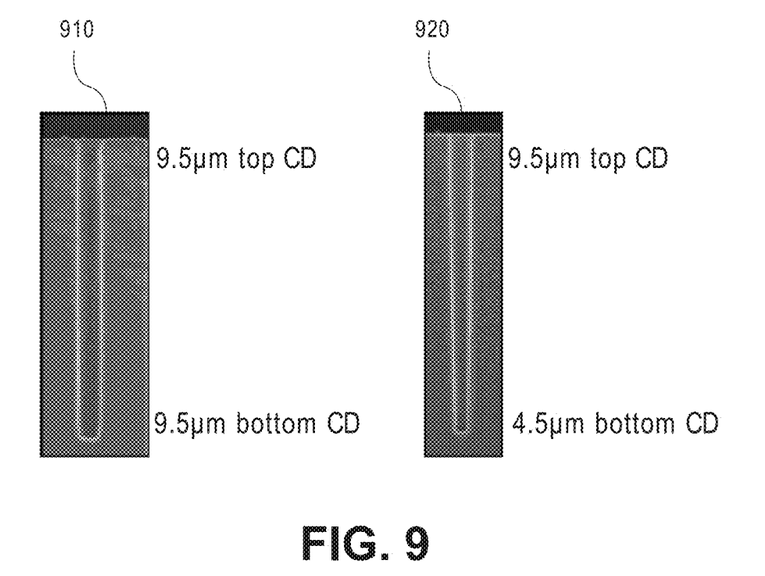
FIG. 9 is an image of trenches with vertical and tapered profiles and smooth sidewalls, according to an embodiment.

FIG. 9 is an image of trenches with vertical and tapered profiles and smooth sidewalls, according to an embodiment. Embodiments of the invention described above can be employed to generate trenches with either vertical or tapered sidewall profiles. For example, embodiments where smoothing occurs post-trench formation or during trench formation may be adjusted to achieve the profiles in images 910 and 920. The images 910 and 920 show via trenches with high aspect ratios (e.g., >100 µm) and smooth sidewalls. The image 910 illustrates a trench with a vertical profile. The vertical profile is due to the top critical dimension and the bottom critical dimension being approximately the same (e.g., as illustrated, both the top and bottom critical dimensions are 9.5 µm). The image 920 illustrates a trench with a tapered profile. The tapered profile is due to a bottom critical dimension which is smaller than a top critical dimension (e.g., as illustrated, the top critical dimension is 9.5 µm while the bottom critical dimension is 4.5 µm). Thus, embodiments of the invention can create trenches with smooth sidewalls which have either vertical or tapered profiles.

Figure 10:
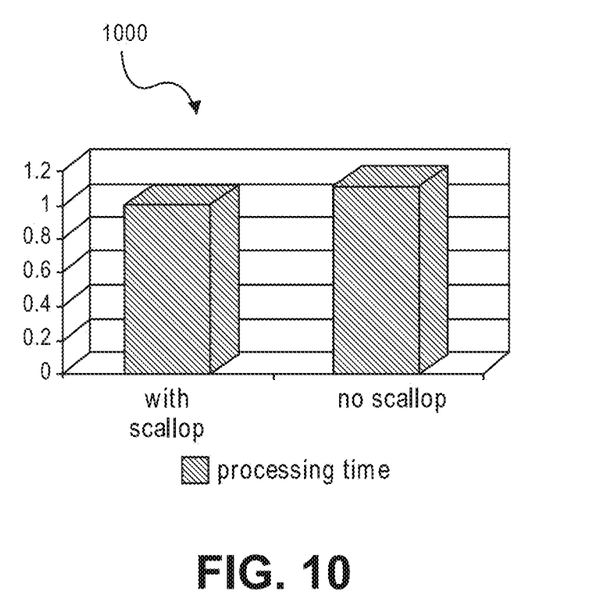
FIG. 10 is a graph showing normalized comparative processing times for via trenches with and without scallops, according to an embodiment.

FIG. 10 is a graph showing normalized comparative processing times for via trenches with and without scallops, according to an embodiment. The graph 1000 shows relative processing times for a trench with an aspect ratio of 10 µm×100 µm, which can be a challenging aspect ratio to achieve. Processing times for other aspect ratios may be similar, or even less for lower aspect ratio trenches. The processing time for a trench without scallops as shown in the graph 1000 can be achieved with the methods described above. Overall TSV etch rate may be affected by, for example, polymer deposition rate, polymer removal rate, silicon etch rate, and etch/deposition time durations. Thus, overall etch rates may be influenced by, for example, ionic bombardment and reactive radical concentration, or flux, at the via trench bottom. This mass transfer to the via trench bottom is dependent on the gas flow regime. Gas flow regimes can be classified based on Knudsen's number, which is given by the expression:

$$Kn = \frac{\lambda}{d}$$

where d is the characteristic dimension and λ is the mean free path. As illustrated in the graph 1000, scallop-free trenches can be achieved with minimal impact to overall process time, and thus can provide a cost-effective etch solution for high volume manufacturing of TSVs. According to an embodiment, the additional time needed to produce scallop-free trenches is approximately 10-15% more than a profile with 30 nm scallops on a 10 µm×100 µm size TSV feature.

Methods of silicon etch for trench sidewall smoothing may be conducted in processing equipment suitable to provide an etch plasma in proximity to a sample for etching. For example, FIG. 11 illustrates a system in which a method of silicon etch for trench sidewall smoothing can be performed, in accordance with an embodiment of the present invention.

Figure 11:
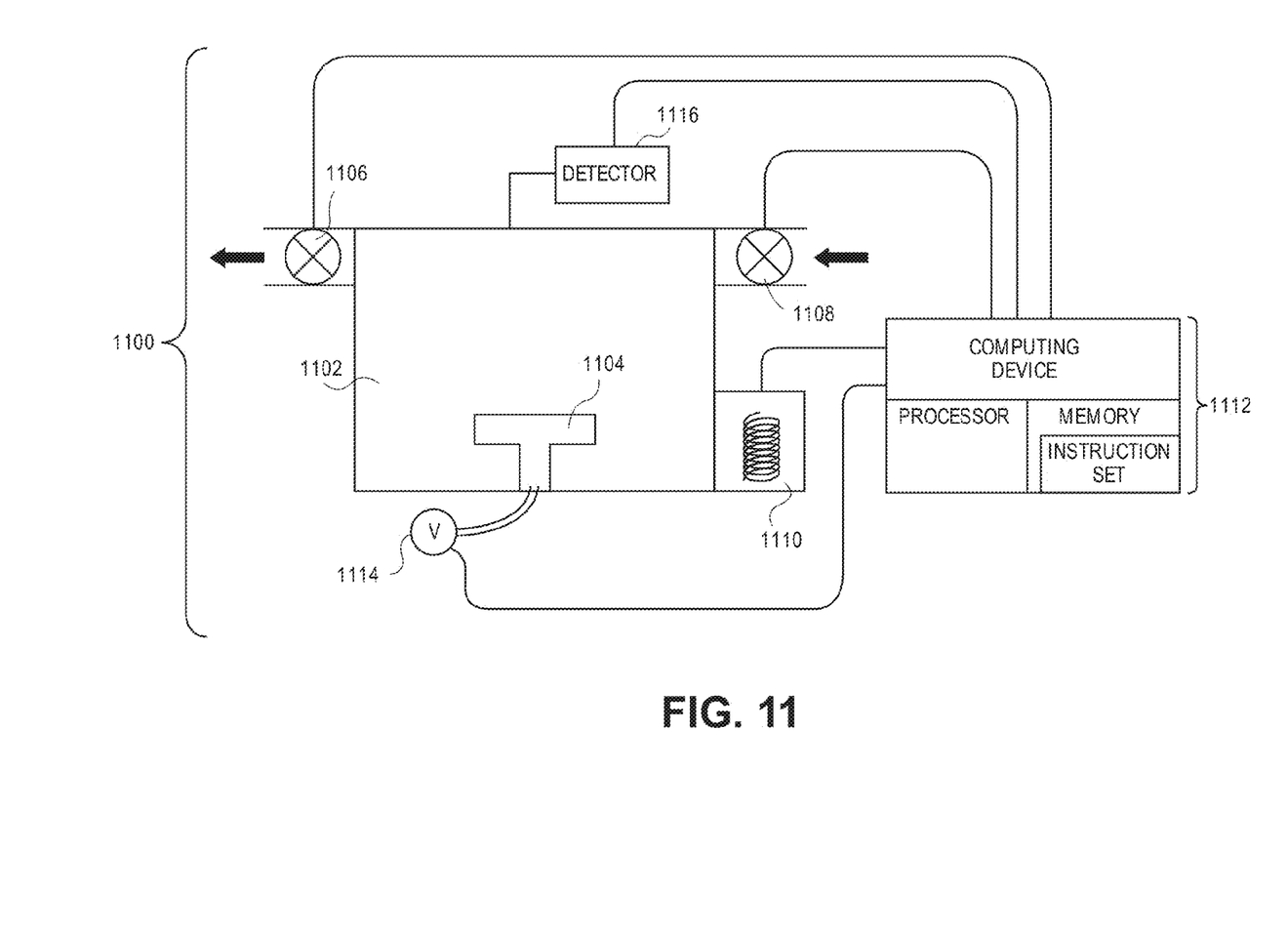
FIG. 11 illustrates a system in which a method of silicon etch for trench sidewall smoothing can be performed, in accordance with an embodiment of the present invention.

Referring to FIG. 11, a system 1100 for conducting a plasma etch process includes a chamber 1102 equipped with a sample holder 1104. The chamber can include a plasma etch chamber for performing etching (e.g., isotropic and/or anisotropic etching) and/or deposition. In one embodiment, the chamber 1102 is a Silvia™ TSV plasma etch chamber made by Applied Materials, Inc. The sample holder 1104 can be a pedestal to support a semiconductor wafer during plasma etch and deposition. An evacuation device 1106, a gas inlet device 1108, and a plasma ignition device 1110 are coupled with chamber 1102. The gas inlet device 1108 can include one or more gas sources to introduce process gases into the chamber. For example, the gas inlet device 1108 can introduce a fluorine gas, a polymerization gas, an oxygen gas, and/or other gases into the process chamber. A computing device 1112 is coupled with plasma ignition device 1110. System 1100 may additionally include a voltage source 1114 coupled with sample holder 1104 and a detector 1116 coupled with chamber 1102. The voltage source 1114 can generate RF pulses to bias a semiconductor disposed over the sample holder 1104 as described above. Computing device 1112 may also be coupled with evacuation device 1106, gas inlet device 1108, voltage source 1114 and detector 1116, as depicted in FIG. 11.

Chamber 1102 and sample holder 1104 may include a reaction chamber and sample positioning device suitable to contain an ionized gas, i.e. a plasma, and bring a sample in proximity to the ionized gas or charged species ejected there from. Evacuation device 1106 may be a device suitable to evacuate and de-pressurize chamber 1102. Gas inlet device 1108 may be a device suitable to inject a reaction gas into chamber 1102. Plasma ignition device 1110 may be a device suitable for igniting a plasma derived from the reaction gas injected into chamber 1102 by gas inlet device 1108. Detection device 1116 may be a device suitable to detect an endpoint of a processing operation. In one embodiment, system 1100 includes a chamber 1102, a sample holder 1104, an evacuation device 1106, a gas inlet device 1108, a plasma ignition device 1110 and a detector 1116 similar to, or the same as, an etch chamber or related chambers used on an Applied Materials® AdvantEdge system.

Figure 12:
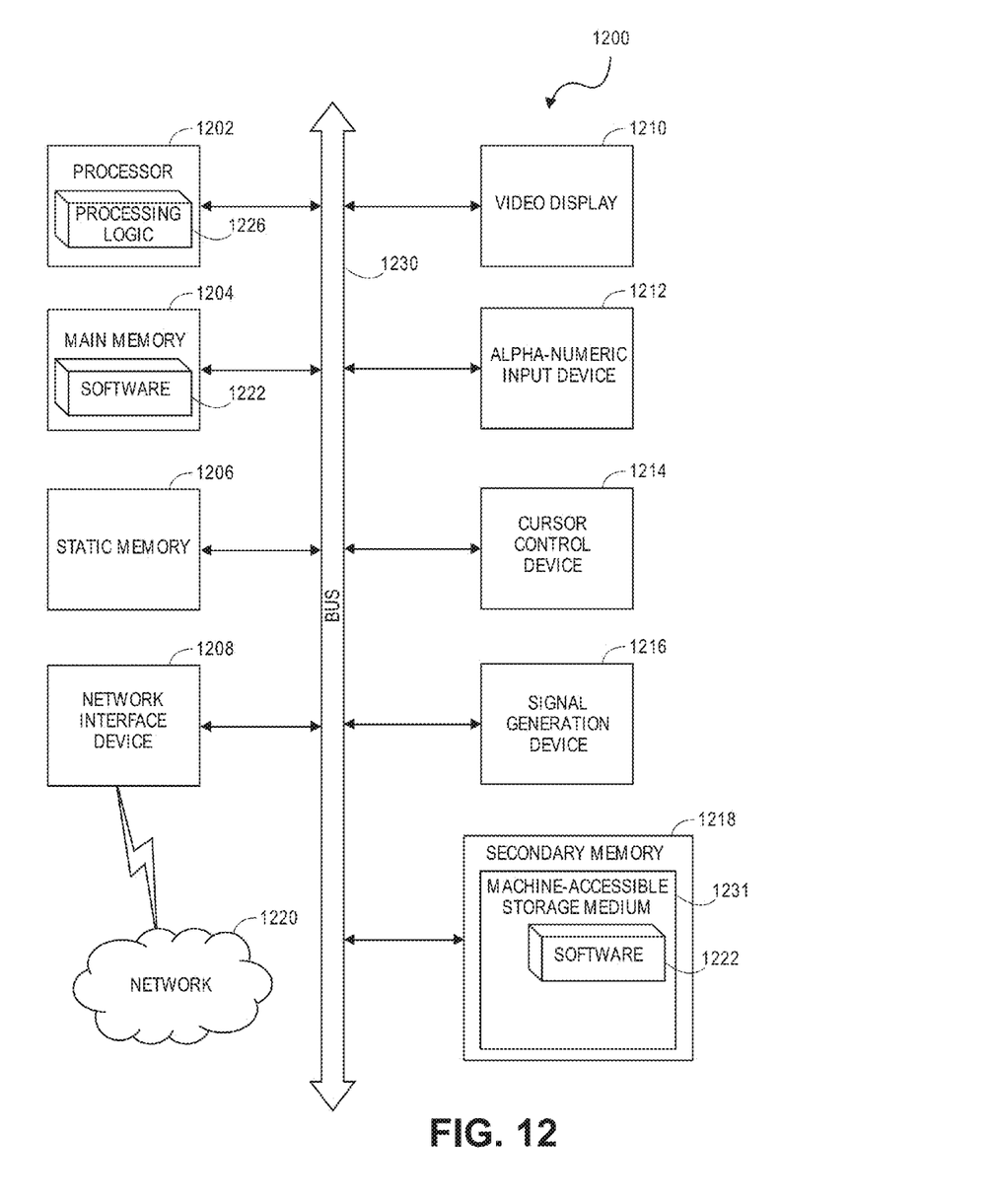
FIG. 12 illustrates a block diagram of an exemplary computer system, in accordance with an embodiment of the present invention.

FIG. 12 illustrates a diagrammatic representation of a machine in the exemplary form of a computer system 1200 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In one embodiment, computer system 1200 is suitable for use as computing device 1112 described in association with FIG. 11.

The exemplary computer system 1200 includes a processor 1202, a main memory 1204 (e.g., read-only memory (ROM), flash memory, dynamic random access memory (DRAM) such as synchronous DRAM (SDRAM) or Rambus DRAM (RDRAM), etc.), a static memory 1206 (e.g., flash memory, static random access memory (SRAM), etc.), and a secondary memory 1218 (e.g., a data storage device), which communicate with each other via a bus 1230.

Processor 1202 represents one or more general-purpose processing devices such as a microprocessor, central processing unit, or the like. More particularly, the processor 1202 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1202 may also be one or more special-purpose processing devices such as an application specific integrated circuit (ASIC), a field programmable gate array (FPGA), a digital signal processor (DSP), network processor, or the like. Processor 1202 is configured to execute the processing logic 1226 for performing the operations discussed herein.

The computer system 1200 may further include a network interface device 1208. The computer system 1200 also may include a video display unit 1210 (e.g., a liquid crystal display (LCD) or a cathode ray tube (CRT)), an alphanumeric input device 1212 (e.g., a keyboard), a cursor control device 1214 (e.g., a mouse), and a signal generation device 1216 (e.g., a speaker).

The secondary memory 1218 may include a machine-accessible storage medium (or more specifically a computer-readable storage medium) 1231 on which is stored one or more sets of instructions (e.g., software 1222) embodying any one or more of the methodologies or functions described herein. The software 1222 may also reside, completely or at least partially, within the main memory 1204 and/or within the processor 1202 during execution thereof by the computer system 1200, the main memory 1204 and the processor 1202 also constituting machine-readable storage media. The software 1222 may further be transmitted or received over a network 1220 via the network interface device 1208.

While the machine-accessible storage medium 1231 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, optical and magnetic media, and other non-transitory storage media.

Thus, methods of silicon etch for trench sidewall smoothing have been disclosed. Embodiments of the invention enable TSV etching to be more robust and controllable. The exemplary methods described above may enable easy and cost effective filling of TSV trenches with various materials.

What is claimed is:

1. A method of smoothing a sidewall of a trench formed in a semiconductor wafer, the method comprising:
   supporting the semiconductor wafer with a pedestal in a processing chamber, the semiconductor wafer comprising the trench;
   introducing a fluorine containing gas into the processing chamber;
   introducing a polymerization gas into the processing chamber concurrently with the fluorine containing gas;
   delivering power to the processing chamber to generate plasma from the fluorine containing gas and the polymerization gas, the plasma generated from the polymerization gas to form a polymer layer on the sidewall of the trench; and
   directionally etching the semiconductor wafer with the plasma generated from the fluorine containing gas to smooth the sidewall of the trench with the polymer layer.

2. The method of claim 1, wherein introducing the polymerization gas into the processing chamber comprises introducing a carbon fluoride gas.

3. The method of claim 2, wherein
   the carbon fluoride gas to form the protective layer on the sidewall of the trench comprises $CHF_3$, $C_2F_6$, $C_3F_8$, or $C_4F_8$.

4. The method of claim 1, wherein delivering the power to the processing chamber comprises applying an RF power source to a plasma source and biasing the semiconductor wafer with a plurality of RF power pulses.

5. The method of claim 4, wherein applying the RF power source comprises applying power in a range of 500-3000 Watts to the plasma source, and wherein biasing the semiconductor wafer comprises biasing the semiconductor wafer with a plurality of power pulses in a second range of 50-1000 Watts each.

6. The method of claim 1, wherein the sidewall of the trench comprises scallops, and wherein directionally etching the semiconductor wafer with the plasma generated from the fluorine containing gas comprises removing the scallops from the sidewall of the trench with the polymer layer.

7. The method of claim 6, wherein the trench formed in the semiconductor wafer comprises a through silicon via (TSV) trench.

8. A method of smoothing a sidewall of a trench formed in a semiconductor wafer, the method comprising:
   introducing a fluorine containing gas into a processing chamber in which the semiconductor wafer is supported, the semiconductor wafer comprising the trench;
   introducing a polymerization gas into the processing chamber concurrently with the fluorine containing gas;
   delivering power to the processing chamber to generate plasma from fluorine containing gas and the polymerization gas, the plasma generated from the polymerization gas to form a polymer layer on the sidewall of the trench; and
   directionally etching, simultaneously with the formation of the polymer layer, the semiconductor wafer with the plasma generated from the fluorine containing gas to smooth the sidewall of the trench.

9. The method of claim 8, wherein introducing the polymerization gas into the processing chamber comprises introducing a carbon fluoride gas.

10. The method of claim 9, wherein
    the carbon fluoride gas to form the polymer layer on the sidewall of the trench comprises $CHF_3$, $C_2F_6$, $C_3F_8$, or $C_4F_8$.

11. The method of claim 8, wherein delivering the power to the processing chamber comprises applying an RF power source to a plasma source and biasing the semiconductor wafer with a plurality of RF power pulses.

12. The method of claim 11, wherein applying the RF power source comprises applying power in a range of 500-3000 Watts to the plasma source, and wherein biasing the semiconductor wafer comprises biasing the semiconductor wafer with a plurality of power pulses in a second range of 50-1000 Watts each.

13. The method of claim 8, wherein the sidewall of the trench comprises scallops, and wherein directionally etching the semiconductor wafer with the plasma generated from the fluorine containing gas comprises removing the scallops from the sidewall of the trench with the polymer layer.

14. The method of claim 13, wherein the trench formed in the semiconductor wafer comprises a through silicon via (TSV) trench.

* * * * *